(12) United States Patent
Garcia

(10) Patent No.: US 6,556,043 B2
(45) Date of Patent: Apr. 29, 2003

(54) ASYNCHRONOUS LATCH DESIGN FOR FIELD PROGRAMMABLE GATE ARRAYS

(75) Inventor: Enrique Garcia, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/907,166

(22) Filed: Jul. 17, 2001

(65) Prior Publication Data

US 2003/0016052 A1 Jan. 23, 2003

(51) Int. Cl.[7] .............................................. H03K 19/177
(52) U.S. Cl. ............................. 326/40; 326/38; 326/39; 326/41; 327/216; 327/217; 327/218
(58) Field of Search ............... 326/38–41; 327/216–218

(56) References Cited

U.S. PATENT DOCUMENTS

| | | | |
|---|---|---|---|
| 5,319,254 A | 6/1994 | Goetting | 307/272.2 |
| 5,646,547 A | 7/1997 | Goetting | 326/46 |
| 5,649,167 A | 7/1997 | Chen et al. | 395/500 |
| 5,821,773 A * | 10/1998 | Norman et al. | 326/39 |
| 5,844,844 A | 12/1998 | Bauer et al. | 365/189.05 |
| 6,011,730 A * | 1/2000 | Sample et al. | 365/189.5 |
| 6,211,696 B1 * | 4/2001 | Skahill et al. | 326/41 |

* cited by examiner

*Primary Examiner*—Daniel Chang
*Assistant Examiner*—Vibol Tan
(74) *Attorney, Agent, or Firm*—Grossman Tucker Perreault & Pfleger, PLLC

(57) ABSTRACT

A programmable logic circuit is provided that solves glitch problems associated with asynchronous logic operations associated with conventional look-up tables by utilizing a preset dominant transparent latch element to replace a conventional look-up table. Since latch elements are normally present in programmable logic circuits (e.g., FPGAs) no additional circuitry is necessary to implement the approach of the present invention. In one exemplary embodiment, an FPGA is provided which includes an array of programmable latch elements, and an array of programmable flip-flop elements generating flip-flop output signals. One or more of the latch elements are programmed to form a preset dominant transparent latch (PDTL) such that the data signals are coupled to the data inputs and preset inputs of the latch. In this manner, the latch operates to replace conventional look-up tables by operating as a primitive OR or NOR gate to generate a desired output.

17 Claims, 4 Drawing Sheets

ASYNCHRONOUS LATCH DESIGN FOR FIELD PROGRAMMABLE GATE ARRAYS

BACKGROUND OF THE INVENTION

1. Field of the Invention

The present invention relates to logic device that uses a transparent latch technique to avoid glitches normally associated with RAM look-up tables. Particular utility of the present invention is found in field programmable gate arrays (FPGA), but has general applicability to any logic device.

2. Description of Related Art

FIG. 3 depicts a conventional field programmable gate array (FPGA) 10. A typical FPGA comprises an array of programmable latch elements 12 and an array of programmable flip-flop logic elements 14. A plurality of flip flop elements are programmed to operate as RAM devices formed into a look up table (LUT) 16 to generate a specified output given two or more input logic signals. Each look-up table receives two or more input signals, designated as signal 1 and signal 2, and generates an output signal, for example, output 1, output 2, output 3, . . . output n. When designing with FPGAs, general logic is normally implemented using RAM look-up tables. The look-up table operates on the defined input signal (signal 1, signal 2, etc.) and the RAM addresses or looks up the pre-programmed answer. While this technique is very efficient, by its very nature can produce glitches in certain situations. While look-up tables are very efficient and generally behave well in synchronous designs, glitches can be present at the outputs in asynchronous designs, i.e., where signal 1 and signal 2 are changing asynchronously.

One technique to remove the problems associated with look-up table designs in FPGAs has been the use of wired-and and wired-or structure based on tri-state internal buses with pull-up resistors. This approach is essentially an open collector technique and is hampered from a performance point of view since performance is limited by the inherently slow rise time (i.e., rc time constant) of the internal buses.

Accordingly, there exists a need to solve the glitch problem associated with asynchronous logic functions in field programmable gate arrays. There further exists a need to solve the aforementioned glitch problems associated with asynchronous logic design without requiring additional external logic to accomplish same.

SUMMARY OF THE INVENTION

Accordingly, the present invention provides a field-programmable gate array (FPGA), comprising an array of programmable latch elements, at least a portion of the latch elements have a data input, a clock input and a preset input; and an array of programmable flip-flop elements generating at least a first and second flip-flop output signals. At least one of said latch elements is adapted to form a preset dominant transparent latch where the first flip-flop output signal is coupled to the data input, the second flip-flop output signal is coupled to the preset input, and the clock input is held constant.

In broader aspects, the present invention provides programmable logic circuit, comprising an array of programmable latch elements, at least one of said latch elements having a data input and a preset input and adapted to form a preset dominant transparent latch; and a first data signal coupled to the data input and a second data signal coupled to the preset input, each data signal representing logic input data.

In the programmable logic circuit and/or FPGA, the preset dominant transparent latch is used in place of a conventional look-up table to generate said desired output signal. Also, the preset dominant transparent latch operates as a primitive logic device wherein the preset dominant transparent latch generates an output signal having a value of the first data signal (e.g., the first flip-flop output signal) OR the second data signal (e.g., the second flip-flop output signal). Alternatively, the preset dominant transparent latch generates an output signal having a value of the first data signal NOR the second data signal.

In method form, the present invention provides a method of replacing a look-up table in an FPGA, said method comprising the steps of designating a conventional latch element as a preset dominant transparent latch (PDTL); supplying a first data signal to a data input of said PDTL; and supplying a second data signal to a preset input of said PDTL. The method can further include the step of supplying a constant signal to a clock input of said PDTL.

DETAILED DESCRIPTION OF THE EXEMPLARY EMBODIMENTS

Figure 1:
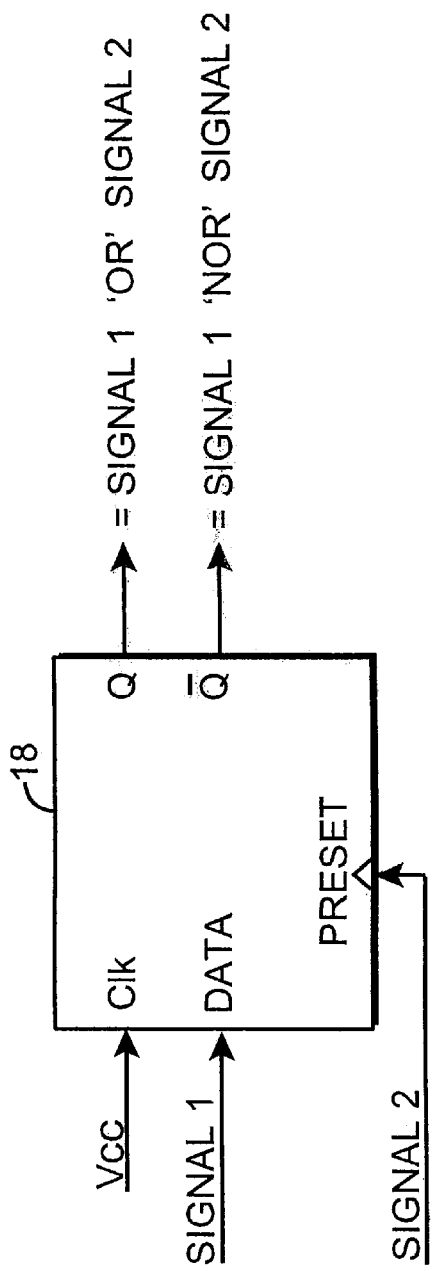
FIG. 1 depicts a preset dominant transparent latch which replaces the look-up table in the field-programmable gate array (FPGA) of the present invention.
Figure 3:
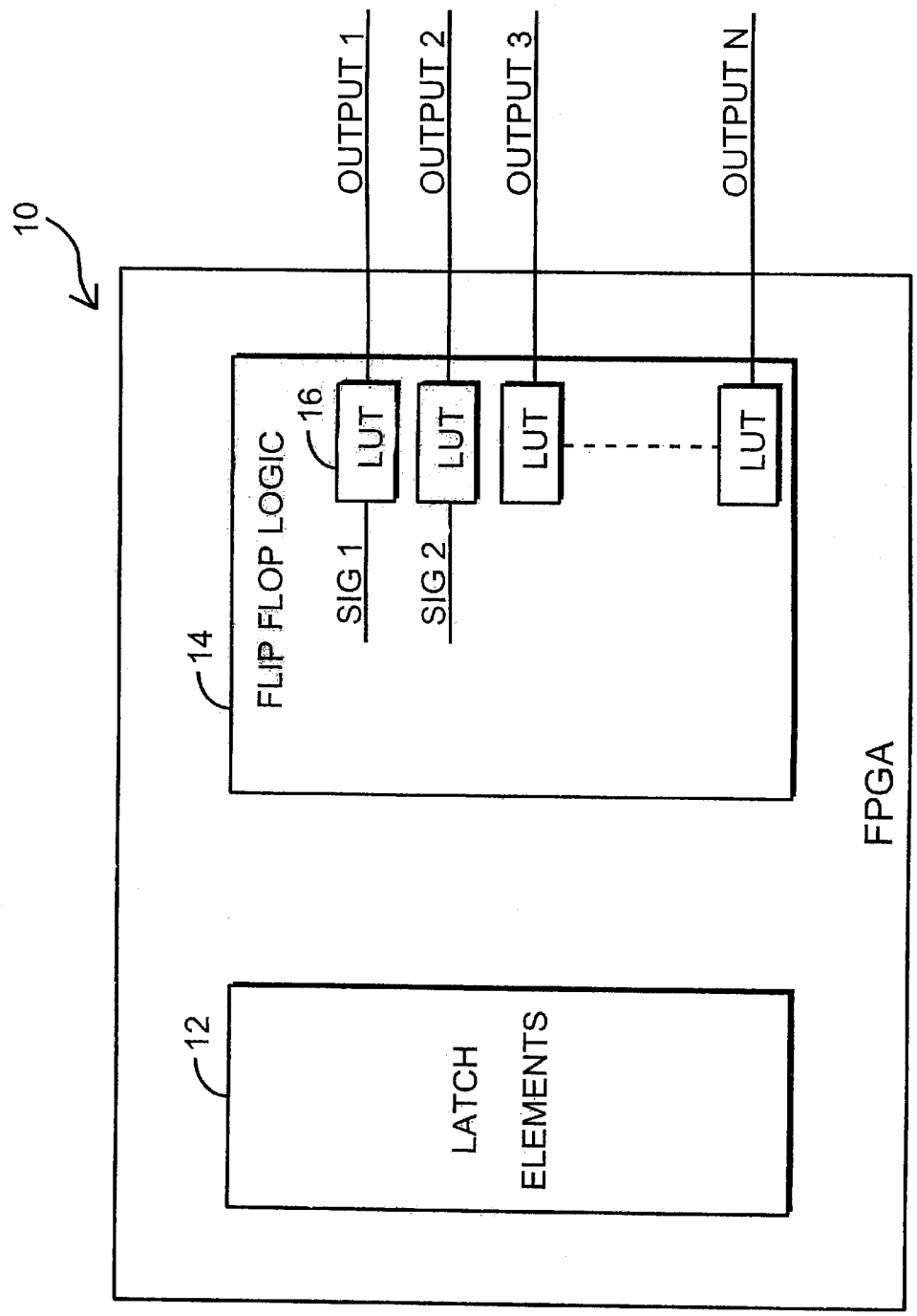
FIG. 3 depicts a conventional field-programmable gate array (FPGA)

To solve the aforementioned glitch problems associated with asynchronous logic operations using LUTs in FPGAs, the present invention utilizes a preset dominant transparent latch element 18 to replace the LUT, as shown in FIG. 1. Since latch elements are normally present in FPGAs, as shown in FIG. 3, no additional circuitry is necessary to implement the approach of the present invention. Rather, the latch elements are programmed to preset dominant transparent latches, as described below. Essentially, the present invention utilizes a latch 18 already contained within the FPGA to implement the desired logic function normally associated with the look-up table.

In one exemplary embodiment shown in FIG. 1, the clock input of the latch 18 is held constant using the power supply signal VCC. Signal 1 is supplied to the data input and signal 2 is supplied to the preset input. Signal 1 and signal 2 represent flip-flop output signals, and are generally defined herein as intermediate output signals from the flip-flop circuitry which are conventionally used as input data to a look-up table. The present invention equally contemplates that Signal 1 and/or Signal 2 need not come specifically or directly from flip-flop logic, but rather, can be generated by any type of digital and/or mixed signal circuitry associated with an FPGA, and are thus broadly defined herein as data inputs which are used to generate a desired output. Of course, since the FPGA is an array of such flip-flop circuits, many sets of flip-flop output signals exist. Thus, the exemplary embodiments depict two signals, Signal 1 and Signal 2, but those skilled in the art will recognize that any number of input signals may be used as input signals, depending on the output logic desired.

The outputs, Q and Q' generate logic OR and logic NOR operations, respectively. This configuration is a preset dominant transparent latch which in normal operation allows the data input (signal 1) to propagate transparently to the Q output whenever the clock signal is a logic 1, and then holds the last value of Q when the clock signal is logic 0. The preset (signal 2) is dominant and always forces the Q output to logic 1 whenever signal 2 is logic 1. Thus, the latch element 18 in the present invention is adapted to behave as a primitive logic element where the output Q is determined by the data or preset inputs, irrespective of the timing signal of the clock (assuming the clock signal is at logic 1).

Figure 2:
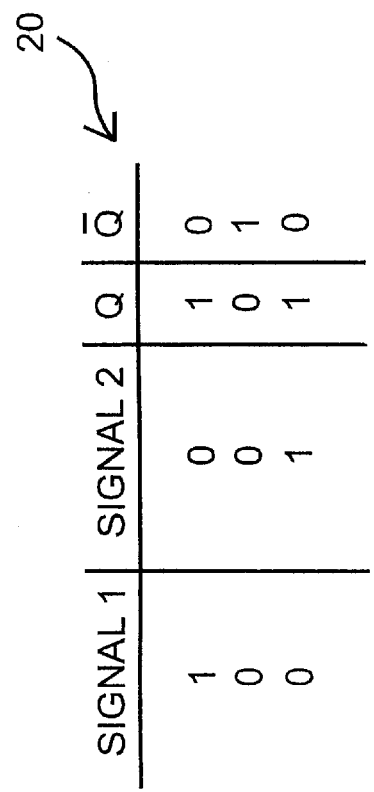
FIG. 2 depicts a truth table of the digital inputs and outputs of the preset dominant transparent latch of FIG. 1.

In the present invention, since the clock signal is permanently tied to the logic one state, signal 1 is connected to the data input and signal 2 is connected to the preset input, the effective is to create a primitive logic operation that does not suffer from glitches associated with asynchronous operation of look-up tables. As shown in the truth table 20 of FIG. 2, the preset dominant latch logically operates as an OR gate for output Q, and a NOR gate for output Q'. Indeed, those skilled in the art will recognize that the primitive logic operation accomplished the present invention is logical OR and logical NOR gates, without requiring additional gates coupled to the output of the FPGA.

Figure 4:
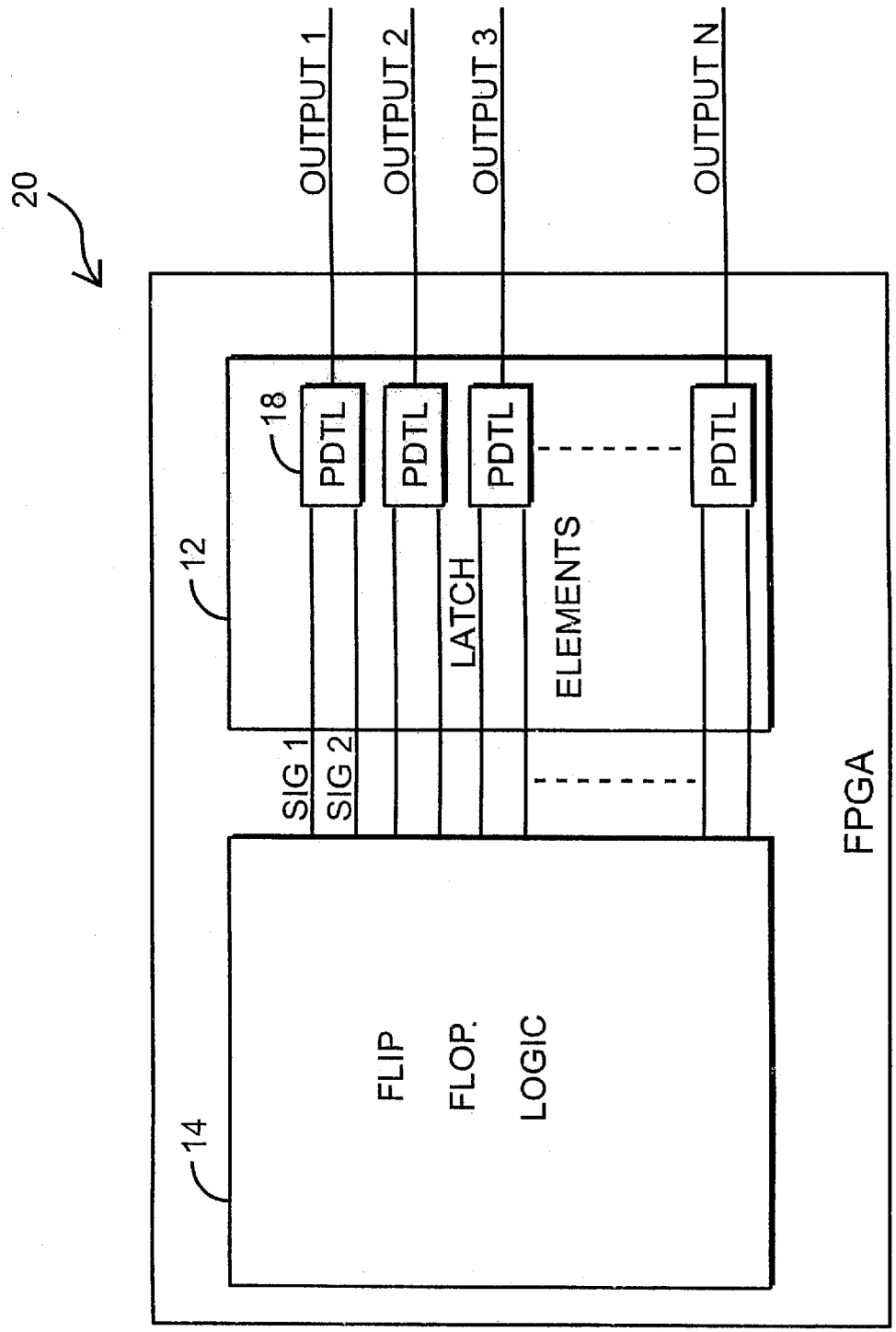
FIG. 4 depicts an FPGA of the present invention.

FIG. 4 depicts the FPGA 20 of the present invention. The FPGA 20 depicts a plurality of latch elements that are modified in accordance with description of FIG. 1 into a plurality of preset dominant transparent latch (PDTL) elements 18. Instead of a plurality of asynchronous look-up tables as is the conventional practice, the present invention utilizes the programmability of the latch elements to create primitive logic functions. The output of the PDTL can be chosen based on OR or NOR logic (Q or Q'), depending on the program requirements of the first and second input signals.

Figure 5:
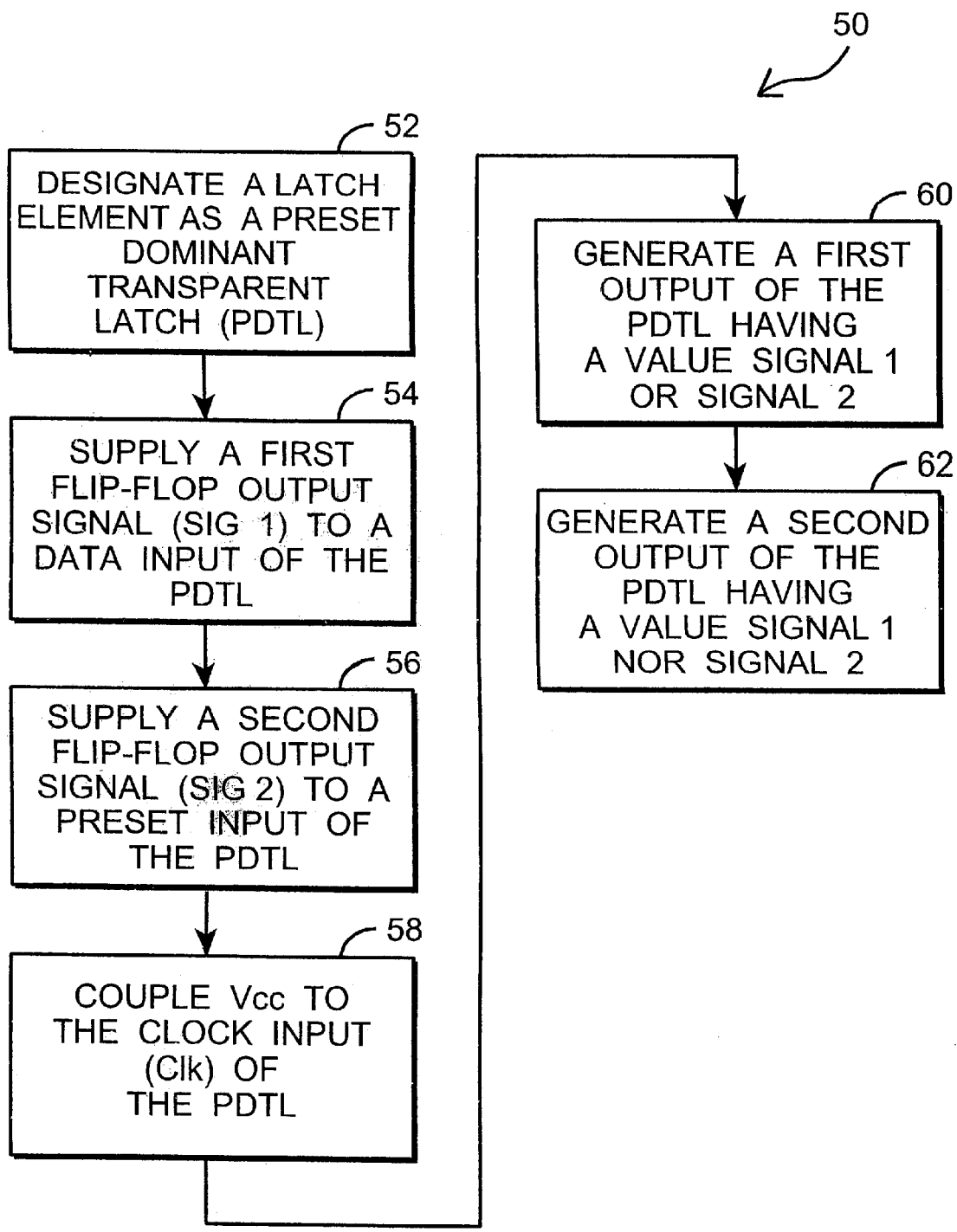
FIG. 5 depicts a flowchart of programming a conventional latch element into a preset dominant transparent latch to generate a programmed output according to the present invention.

FIG. 5 depicts a flowchart 50 of programming a conventional latch element into a preset dominant transparent latch to generate a programmed output according to the present invention. In a first step 52, an existing conventional latch element is designated as a preset dominant transparent latch element (PDTL) that is used to generate an output instead of a lookup table. A first flip-flop output signal (e.g., Signal 1) is supplied to the DATA input of the PDTL 54, and a second flip-flop output signal (e.g., Signal 2) is supplied to the PRESET input of the PDTL 56. A constant signal, for example Vcc is coupled to the CLK (clock) input 58. In this manner, the Q output represent an OR operation of Signal 1 and Signal 2 (step 60), while the compliment output represents the NOR operation of Signal 1 and Signal 2 (step 62). Either output can be chosen, depending on the desired output for a given set of inputs.

Thus, by modifying a latch already available in an FPGA, the present invention solves the glitch problem described above, without the need for additional circuitry. Those skilled in the art will recognize that the latch of FIG. 1 can be used as the building blocks for larger more complicated logic circuits, including three or more input circuits and/or cascading combinational logic circuits. Those skilled in the art will also recognize that the relevant portions of the FPGA of the present invention (i.e., flip-flop elements, latch elements, etc.) are fully programmable, and thus modifying conventional latch elements according to the present invention can be formed by pre-existing program routines. These and other modifications to the present invention will become apparent to those skilled in the art, and all such modifications are deemed within the spirit and scope of the present invention, only as limited by the appended claims.

What is claimed is:

1. A field-programmable gate array (FPGA), comprising:
   an array of programmable latch elements, at least a portion of said latch elements having a data input, a clock input and a preset input; and
   an array of programmable flip-flop elements generating at least a first and second flip-flop output signals;
   wherein at least one of said latch elements being adapted to form a preset dominant transparent latch wherein said first flip-flop output signal is coupled to said data input, said second flip-flop output signal is coupled to said preset input, and said clock input is held constant.

2. A field-programmable gate array (FPGA) as claimed in claim 1, wherein said preset dominant transparent latch generating an output signal having a value of said first flip-flop output signal OR said second flip-flop output signal.

3. A field-programmable gate array (FPGA) as claimed in claim 1, wherein said preset dominant transparent latch generating an output signal having a value of said first flip-flop output signal NOR said second flip-flop output signal.

4. A method of replacing a look-up table in an FPGA, said method comprising the steps of:
   designating a conventional latch element as a present dominant transparent latch (PDTL);
   supplying a first data signal to a data input of said PDTL;
   supplying a second data signal to a present input of said PDTL; and
   supplying a constant signal to a clock input of said PDTL.

5. A method as claimed in claim 4, further comprising the step of:
   generating an output signal comprising the logical OR operation of said first and second data signals.

6. A method as claimed in claim 4, further comprising the step of:
   generating an output signal comprising the logical NOR operation of said first and second data signals.

7. A programmable logic circuit, comprising:
   an array of programmable latch elements, at least one of said latch elements having a data input and a preset input and adapted to form a preset dominant transparent latch; and
   a first data signal coupled to said data input and a second data signal coupled to said preset input, each said data signal representing logic input data and wherein said preset dominant transparent latch generating a desired output signal based on said data signals,
   said latch element further comprising a clock input, said clock input being coupled to a constant input signal.

8. A programmable logic circuit as claimed in claim 7, wherein said preset dominant transparent latch generating an output signal having a value of said first data signal OR said second data signal.

9. A programmable logic circuit as claimed in claim 7, wherein said preset dominant transparent latch generating an output signal having a value of said data signal NOR said second data signal.

10. A programmable logic circuit as claimed in claim 7, further comprising a plurality of programmable flip-flop elements.

11. A programmable logic circuit as claimed in claim 10, wherein said data signals generated by one or more of said plurality of flip-flop elements.

12. A programmable logic circuit as claimed in claim 7, wherein said preset dominant transparent latch being used in place of a conventional look-up table to generate said desired output signal.

13. A field-programmable gate array (FPGA) as claimed in claim 1, wherein said preset dominant transparent latch being used in place of a conventional look-up table to generate a desired output signal.

14. A method as claimed in claim 4, further comprising the step of:

replacing a conventional look-up table with said PDTL.

15. A field-programmable gate array (FPGA), comprising:

an array of programmable latch elements, at least one of said latch elements having a data input, a clock input and a preset input; and an array of programmable flip-flop elements generating at least a first and second flip-flop output signals;

wherein at least one of said latch elements being adapted to form a preset dominant transparent latch (PDTL) wherein said first flip-flop output signal is coupled to said data input, said second flip-flop output signal is coupled to said preset input, and said clock input is held constant, and wherein said PDTL being used in place of a conventional look-up table to generate a desired output signal.

16. A field-programmable gate array (FPGA) as claimed in claim 15, wherein said preset dominant transparent latch generating said desired output signal having a value of said first flip-flop output signal OR said second flip-flop output signal.

17. A field-programmable gate array (FPGA) as claimed in claim 15, wherein said preset dominant transparent latch generating said desired output signal having a value of said first flip-flop output signal NOR said second flip-flop output signal.

* * * * *